United States Patent
Lee et al.

(10) Patent No.: US 11,051,396 B2
(45) Date of Patent: Jun. 29, 2021

(54) INTEGRATED CIRCUIT CAPABLE OF CONTROLLING IMPEDANCE AND ELECTRONIC DEVICE INCLUDING THE SAME

(71) Applicant: Samsung Electronics Co., Ltd., Gyeonggi-do (KR)

(72) Inventors: Cheolho Lee, Gyeonggi-do (KR); Seungjoon Yoon, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/564,040

(22) Filed: Sep. 9, 2019

(65) Prior Publication Data
US 2020/0092983 A1 Mar. 19, 2020

(30) Foreign Application Priority Data
Sep. 14, 2018 (KR) .................. 10-2018-0110323

(51) Int. Cl.
*H05K 7/00* (2006.01)
*H05K 1/02* (2006.01)
*H05K 1/18* (2006.01)
*H03H 7/38* (2006.01)

(52) U.S. Cl.
CPC ............. *H05K 1/0213* (2013.01); *H03H 7/38* (2013.01); *H05K 1/181* (2013.01); *H05K 2201/10356* (2013.01); *H05K 2201/10507* (2013.01)

(58) Field of Classification Search
CPC .......... H05K 1/0213; H05K 1/181; H05K 2201/10356; H05K 2201/10507; H03H 7/38; H03K 19/0005
See application file for complete search history.

(56) References Cited

U.S. PATENT DOCUMENTS

| | | | |
|---|---|---|---|
| 4,908,576 A | 3/1990 | Jackson | |
| 6,351,172 B1 | 2/2002 | Ouyang et al. | |
| 7,969,181 B1 | 6/2011 | Fefer et al. | |
| 8,896,341 B2 | 11/2014 | Sofer et al. | |
| 9,484,916 B1 * | 11/2016 | Chia | H03K 19/0005 |

(Continued)

FOREIGN PATENT DOCUMENTS

| | | |
|---|---|---|
| CN | 107832245 A | 3/2018 |
| JP | 2001-077678 A | 3/2001 |

(Continued)

OTHER PUBLICATIONS

International Search Report dated Jan. 3, 2020.
European Search Report dated Jan. 3, 2020.

*Primary Examiner* — Yuriy Semenenko
(74) *Attorney, Agent, or Firm* — Cha & Reiter, LLC

(57) ABSTRACT

Disclosed is an electronic device. The electronic device may include a printed circuit board (PCB) including at least one conducting wire, a first integrated circuit (IC) placed on the printed circuit board and including a transmit pin electrically connected to the at least one conducting wire, and a second IC placed on the printed circuit board and including a receive pin electrically connected to the at least one conducting wire, wherein the first IC is configured to transmit a specified signal having a first voltage through the transmit pin, and change an internal impedance of the first IC based on a reflected signal of the specified signal at a first time point.

10 Claims, 14 Drawing Sheets

(56) References Cited

U.S. PATENT DOCUMENTS

| | | |
|---|---|---|
| 9,910,482 B2 | 3/2018 | Brunolli et al. |
| 10,396,788 B2 | 8/2019 | Amiri et al. |
| 2003/0122574 A1 | 7/2003 | Kushida |
| 2004/0150424 A1 | 8/2004 | Wuppermann |
| 2006/0054686 A1* | 3/2006 | Brandl ............... H03H 7/38 235/380 |
| 2008/0119153 A1* | 5/2008 | Sugiyama ............ H03F 3/24 455/245.1 |
| 2009/0206962 A1* | 8/2009 | Chou ................. H04B 3/14 333/28 R |
| 2011/0163828 A1 | 7/2011 | Chou et al. |
| 2012/0139669 A1 | 6/2012 | Chou et al. |
| 2013/0169311 A1 | 7/2013 | Monga |
| 2014/0184356 A1* | 7/2014 | Kihara ............. H03H 7/1741 333/174 |
| 2017/0317675 A1* | 11/2017 | Amiri ................. H04B 3/04 |
| 2018/0026634 A1 | 1/2018 | Park et al. |
| 2018/0129267 A1 | 5/2018 | Brunolli et al. |
| 2018/0343000 A1* | 11/2018 | Nosaka ............... H04B 1/48 |

FOREIGN PATENT DOCUMENTS

| | | |
|---|---|---|
| JP | 2004-363861 A | 12/2004 |
| KR | 10-0883398 B1 | 2/2009 |
| KR | 10-2013-0068354 A | 6/2013 |
| WO | 2011/154774 A1 | 12/2011 |
| WO | 2017/053097 A1 | 3/2017 |

* cited by examiner

INTEGRATED CIRCUIT CAPABLE OF CONTROLLING IMPEDANCE AND ELECTRONIC DEVICE INCLUDING THE SAME

CROSS-REFERENCE TO RELATED APPLICATION(S)

This application is based on and claims priority under 35 U.S.C. § 119 to Korean Patent Application No. 10-2018-0110323, filed on Sep. 14, 2018, in the Korean Intellectual Property Office, the disclosure of which is incorporated by reference herein its entirety.

BACKGROUND

1. Field

The disclosure relates to an integrated circuit capable of controlling an impedance and an electronic device including the same.

2. Description of Related Art

As information technology develops, various types of electronic devices such as a smartphone, a tablet personal computer (PC), and the like are being widely supplied. As the functionality increases and size of the electronic devices decreases, more components must share less space. Accordingly, it is desirable that signals transmitted from a transmitting component are accurately received by receiving component.

The above information is presented as background information only to assist with an understanding of the disclosure. No determination has been made, and no assertion is made, as to whether any of the above might be applicable as prior art with regard to the disclosure.

SUMMARY

In accordance with an aspect of the disclosure, an electronic device may include a printed circuit board (PCB) including at least one conducting wire; a first integrated circuit (IC) placed on the printed circuit board and including a transmit pin electrically connected to the at least one conducting wire; and a second IC placed on the printed circuit board and including a receive pin electrically connected to the at least one conducting wire, wherein the first IC is configured to: transmit a specified signal having a first voltage through the transmit pin; change an internal impedance of the first IC based on a reflected signal of the specified signal at a first time point.

In accordance with another aspect of the invention, a method of changing an impedance of an integrated circuit included in an electronic device, the method comprises transmitting a specified signal having a first voltage through a transmit pin; measuring a second voltage of the transmit pin, the second voltage including a reflection component of the specified signal, at a first time point, obtaining an impedance of at least one conducting wire electrically connected with the integrated circuit based on the first voltage and the measured second voltage, and changing an internal impedance of the integrated circuit based on the obtained impedance of the at least one conducting wire.

An integrated circuit which is placed on a printed circuit board, including a transmit pin for transmitting a specified electrical signal to another integrated circuit through at least one conducting wire included in the printed circuit board, a transmit buffer including a plurality of impedance elements and a demultiplexer for connecting one of the plurality of impedance elements with the transmit pin, and at least one controller electrically connected with the transmit buffer, wherein the at least one controller is configured to: connect a first impedance element of the plurality of impedance elements with the transmit pin by using the demultiplexer; output a specified signal having a first voltage to the transmit pin; obtain an impedance of the at least one conducting wire based on the first voltage and a measured second voltage including a reflection signal of the specified signal; and connect a second impedance element of the plurality of impedance elements with the transmit pin based on the a reflection signal of the specified signal at a first time point.

Other aspects, advantages, and salient features of the disclosure will become apparent to those skilled in the art from the following detailed description, which, taken in conjunction with the annexed drawings, discloses certain embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

With regard to description of drawings, similar components may be marked by similar reference numerals.

DETAILED DESCRIPTION

A large number of integrated circuits may be mounted on at least one printed circuit board (PCB) or flexible printed circuit (FPC).

The PCB or FPC may electrically connect various electronic components including integrated circuits such that the electronic components are stably interconnected within a limited space. The PCB or FPC may be implemented by stacking a plurality of layers, and conducting wires capable of electrically connecting the electronic components may be placed in at least one of the plurality of layers.

With the miniaturization or integration of the electronic device is required, the PCB or FPC are getting smaller. As such, it is necessary to manufacture conducting wires included in at least one layer of the PCB or FPC with a smaller size.

The conducting wires included in the PCB or FPC may have an impedance of a specified magnitude. For example, a conducting wire may have an impedance of a specified value that is calculated based on a thickness, a width, or a length of the conducting wire. However, the impedance of the conducting wire may, during transmission of a signal, cause a reflection signal. The reflection component may cause distortion of a signal that is transmitted. To decrease this signal distortion, the integrated circuit may be designed such that an internal impedance is matched with the impedance of the conducting wire.

However, while the integrated circuits are designed to match the impedance of the conducting wire, during the manufacturing the conducting wire may have a different impedance. For example, conducting wires included in a plurality of PCBs manufactured with the same design may have impedances of different values. In addition, as the size of the conducting wire is designed to be gradually small, the error of the impedance may become greater in percentage. For example, even though an error of tens micrometers identically occurs in conducting wires of different sizes, a percentage of the error may appear to be greater in a conducting wire of a smaller size. The different impedances between the integrated circuits and the conducting wire can transmitted signals to have reflection signal.

As such, even though an integrated circuit is manufactured to have a specified internal impedance matched with an impedance of a conducting wire included in the PCB or FPC, distortion of a specified level or higher may occur in a signal that is transmitted from the integrated circuit. Also, a level of the distortion in the signal may vary depending on a connected PCB or FPC.

Aspects of the disclosure may address at least the above-mentioned problems and/or disadvantages and may provide at least the advantages described below. Accordingly, an aspect of the disclosure provides an electronic device that may mitigate the above-described problem and problems brought up in this specification.

Figure 1:
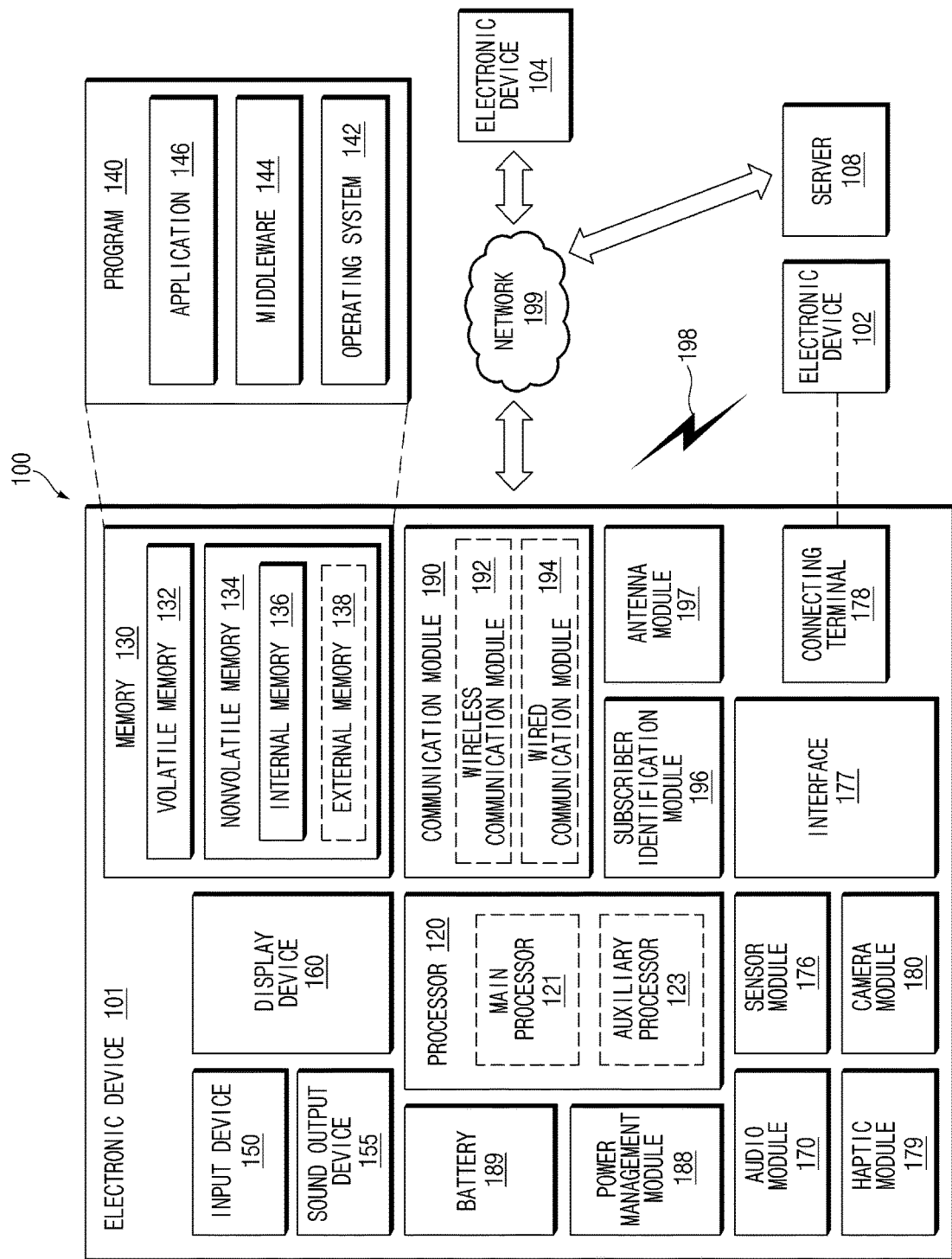
FIG. 1 is a block diagram illustrating an electronic device in a network environment according to certain embodiments.

FIG. 1 is a block diagram illustrating an electronic device 101 in a network environment 100 according to certain embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
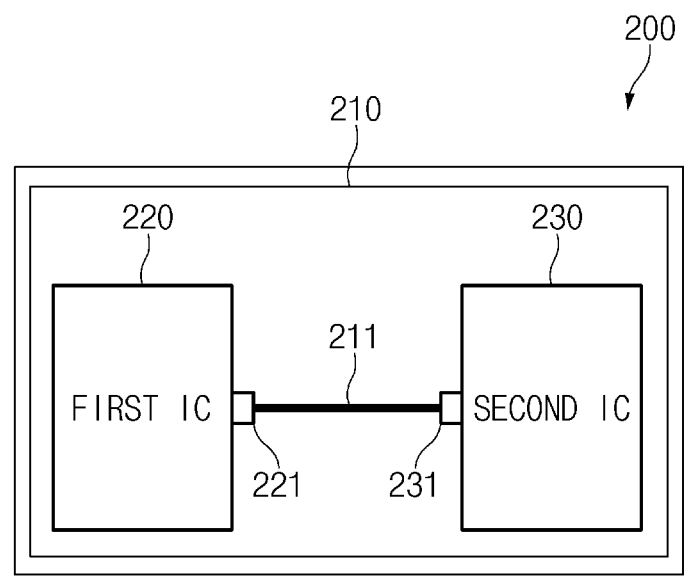
FIG. 2 illustrates a block diagram of an electronic device, according to an embodiment.

FIG. 2 illustrates a block diagram of an electronic device, according to an embodiment.

Referring to FIG. 2, an electronic device 200 (e.g., the electronic device 100 of FIG. 1) may include a printed circuit board (PCB) 210, a first integrated circuit (IC) 220, and a second IC 230. According to one embodiment the printed circuit board (PCB) 210 includes at least one conducting wire 211. The first integrated circuit (IC) 220 is placed on the printed circuit board includes a transmit pin 221 electrically connected to the at least one conducting wire 211. The second IC 230 is placed on the printed circuit board 210 includes a receive pin 231 that electrically connected to the at least one conducting wire 211. The first IC 220 is configured to transmit a specified signal having a first voltage through the transmit pin 221, and change an internal impedance of the first IC 220 based on a reflected signal of the specified signal at a first time point.

The electronic device 200 may mitigate reflection signals caused by initial differences in impedances of the first integrated circuit 220, conducting wire 211, and second integrated circuit 230, because the first integrated circuit 220 and second integrated circuit 230 can change their respect internal impedances based on the impedance of the wire.

The first integrated circuit 220 can transmit a specified signal, and measure the reflection signal at a first time point or period. Based on the reflection signal, the first integrated circuit can determine the impedance of the conducting wire 211. Based on the impedance of the wire the first integrated circuit 220 change its internal impedance. The changed internal impedance can be chosen to decrease subsequent reflection signals, by for example, matching or approximating the impedance of the wire 211. The first integrated circuit 220 can then notify the second integrated circuit 230 of the impedance of the conducting wire 211. The second integrated circuit 230 can use this information to accordingly change its impedance to, for example, match or approximate the impedance of the conducting wire 211.

The electronic device 200 is not limited to the configuration illustrated in FIG. 2. For example, the electronic device 200 may further include a component that is not illustrated in FIG. 2, or a part of the components illustrated in FIG. 2 may not be omitted or may be replaced with any other component(s). In the present disclosure, for example, a description will be given as the first IC 220 and the second IC 230 are positioned on the printed circuit board 210, but the printed circuit board 210 may be replaced with a component that is the same as or similar to the printed circuit board 210. For example, the printed circuit board 210 may be replaced with a flexible printed circuit (FPC) or a flexible printed circuit board (FPCB). Accordingly, the term "printed circuit board" shall be understood to include flexible printed circuits and flexible printed circuit boards.

According to an embodiment, various kinds of electronic parts, elements, or printed circuits of the electronic device 200 may be mounted on the printed circuit board 210. For example, the first IC 220, the second IC 230, and a first conducting wire 211 may be mounted on the printed circuit board 210. For another example, an application processor (AP), a communication processor (CP), a memory, or the like may be mounted on the printed circuit board 210. In the present disclosure, the printed circuit board 210 may be referred to as a "first PCB", a "main PCB", a "main board", or a "printed board assembly (PBA)".

According to an embodiment, the printed circuit board 210 may include a plurality of layers. For example, the printed circuit board 210 may have a structure in which a layer including a conductive material and a layer including a non-conductive material are alternately stacked. For another example, the printed circuit board 210 may include a layer where at least one conducting wire (e.g., the first conducting wire 211) is placed.

According to an embodiment, the plurality of layers may include a conductive material, and/or a via hole formed between at least some layers of the plurality of layers. The conductive material or the via hole may electrically connect different layers. For example, a conducting wire (e.g., the first conducting wire 211) placed in a first layer may be extended to a second layer through the via hole.

According to an embodiment, the first conducting wire 211 may be placed in at least one layer of the printed circuit board 210. In an embodiment, the first conducting wire 211 may electrically connect the first IC 220 and the second IC 230, and a specified electrical signal may be exchanged between the first IC 220 and the second IC 230 through the first conducting wire 211. The first conducting wire 211 may have an impedance of a specified magnitude. For example, the magnitude of the impedance may be proportional to a length of the first conducting wire 211 and may be inversely proportional to the cross-sectional area of the first conducting wire 211. According to an embodiment, the first conducting wire 211 may be designed to have an impedance of a specified magnitude (e.g., 50Ω or 100Ω). However, the actual impedance value of the first conducting wire 211 may be different due to an error occurring in manufacturing. For example, the first conducting wire 211 may have an impedance different from a value designated in designing, due to an error of the length or cross-sectional area of the first conducting wire 211 in manufacturing. Additionally, the impedance of the first conducting wire 211 may vary depending on an environment change or over time. For example, the impedance of the first conducting wire 211 may have a value that varies depending on the internal temperature of the electronic device 200.

The first IC 220 may be an integrated circuit placed on one surface of the printed circuit board 210. According to an embodiment, the first IC 220 may transmit a specified electrical signal through the first conducting wire 211. According to an embodiment, the first IC 220 may include at least one pin connected with the first conducting wire 211. For example, the first IC 220 may include a transmit pin 221 connected with the first conducting wire 211 and may transmit a specified electrical signal to the second IC 230 through the first conducting wire 211 by using the transmit pin 221.

According to an embodiment, the first IC 220 may have an internal impedance. The internal impedance may be an impedance when the interior of the first IC 220 is seen from the transmit pin 221 of the first IC 220. According to an embodiment, the first IC 220 may change the internal impedance so as to be matched with the impedance of the first conducting wire 211. For example, the first IC 220 may connect one impedance matched with the impedance of the first conducting wire 211 from among a plurality of internal impedances with the transmit pin 221. When the internal impedance is matched with the impedance of the first conducting wire 211, the reflection signal of the signal transmitted from the first IC 220 due to the first conducting wire 211 may be minimized.

According to an embodiment, the first IC 220 may obtain the impedance of the first conducting wire 211 for the purpose of matching the internal impedance with the impedance of the first conducting wire 211. For example, the first IC 220 may transmit a specified signal with a first voltage through the transmit pin 221. In an embodiment, the first voltage may be implemented with a differential voltage for the purpose of removing a noise component. When impedance matching is not yet made, a reflection signal may occur in the transmitted signal, and the first IC 220 may measure a voltage of the transmit pin 221, in which the reflection signal is included, that is, a second voltage within a specified time. The first IC 220 may use the reflection signal, based on the first voltage to determine the impedance of the first conduction wire 211.

According to an embodiment, the first IC 220 may further include a plurality of pins that are different from the transmit pin 221. For example, the first IC 220 may further include a receive pin or a separate test pin. The receive pin may be a pin for receiving a specified signal from any other integrated circuit, for example, the second IC 230. In an embodiment, the receive pin may be combined with the transmit pin 221. The separate test pin may be a pin for applying a test signal for the purpose of obtaining an impedance of a conducting wire included in the printed circuit board 210.

According to an embodiment, the first IC 220 may obtain the impedance of the first conducting wire 211 by using the test pin. For example, the first IC 220 may apply a test signal with the first voltage to the first conducting wire 211 through the test pin. When impedance matching is not yet made, a reflection signal may occur in the transmitted test signal, and the first IC 220 may measure a voltage of the transmit pin 221, in which the reflection signal is included, that is, the second voltage within a specified time. Because the first voltage and the reflection signal are included in the second voltage, the first IC 220 may obtain the impedance of the first conducting wire 211 causing the reflection signal, based on the first voltage and the second voltage.

According to an embodiment, the first IC 220 may optimize a transmission power. For example, the first IC 220 may transmit a specified signal with the first voltage, and may measure a voltage of the transmit pin 221 (or the test pin), that is, a third voltage after a specified time elapses. The third voltage may be a voltage of the transmit pin 221, which is converged into a given value. For example, the third voltage may be a voltage in which only a direct current component remains. According to an embodiment, the first IC 220 may obtain a loss voltage due to the printed circuit board 210, based on the first voltage and the third voltage. The first IC 220 may optimize the transmission power of the first IC 220 based on the obtained loss voltage. For example, the first IC 220 may change the transmission power such that the loss voltage is minimized.

According to an embodiment, the first IC 220 may transmit information about the printed circuit board 210, for example, information about the impedance of the first conducting wire 211 or information about the loss voltage due to the printed circuit board 210, to the second IC 230 through the first conducting wire 211.

The second IC 230 may be an integrated circuit placed on the one surface of the printed circuit board 210. According to an embodiment, the second IC 230 may receive a specified electrical signal through the first conducting wire 211. According to an embodiment, the second IC 230 may include at least one pin connected with the first conducting wire 211. For example, the second IC 230 may include a receive pin 231 connected with the first conducting wire 211 and may receive a specified electrical signal through the first conducting wire 211 by using the receive pin 231.

According to an embodiment, the second IC 230 may receive the information about the printed circuit board 210, for example, information about the impedance of the first conducting wire 211 or the information about the loss voltage due to the printed circuit board 210 from the first IC 220. In an embodiment, the second IC 230 may change an internal parameter of the second IC 230, for example, an internal impedance of the second IC 230 based on the received information.

According to certain embodiments, both the first IC 220 and the second IC 230 may transmit an electrical signal or may receive an electrical signal. However, in the present disclosure, the first IC 220 may be understood as a transmitter IC for transmitting an electrical signal, and the second IC 230 may be understood as a receiver IC for receiving the electrical signal.

Figure 3A:
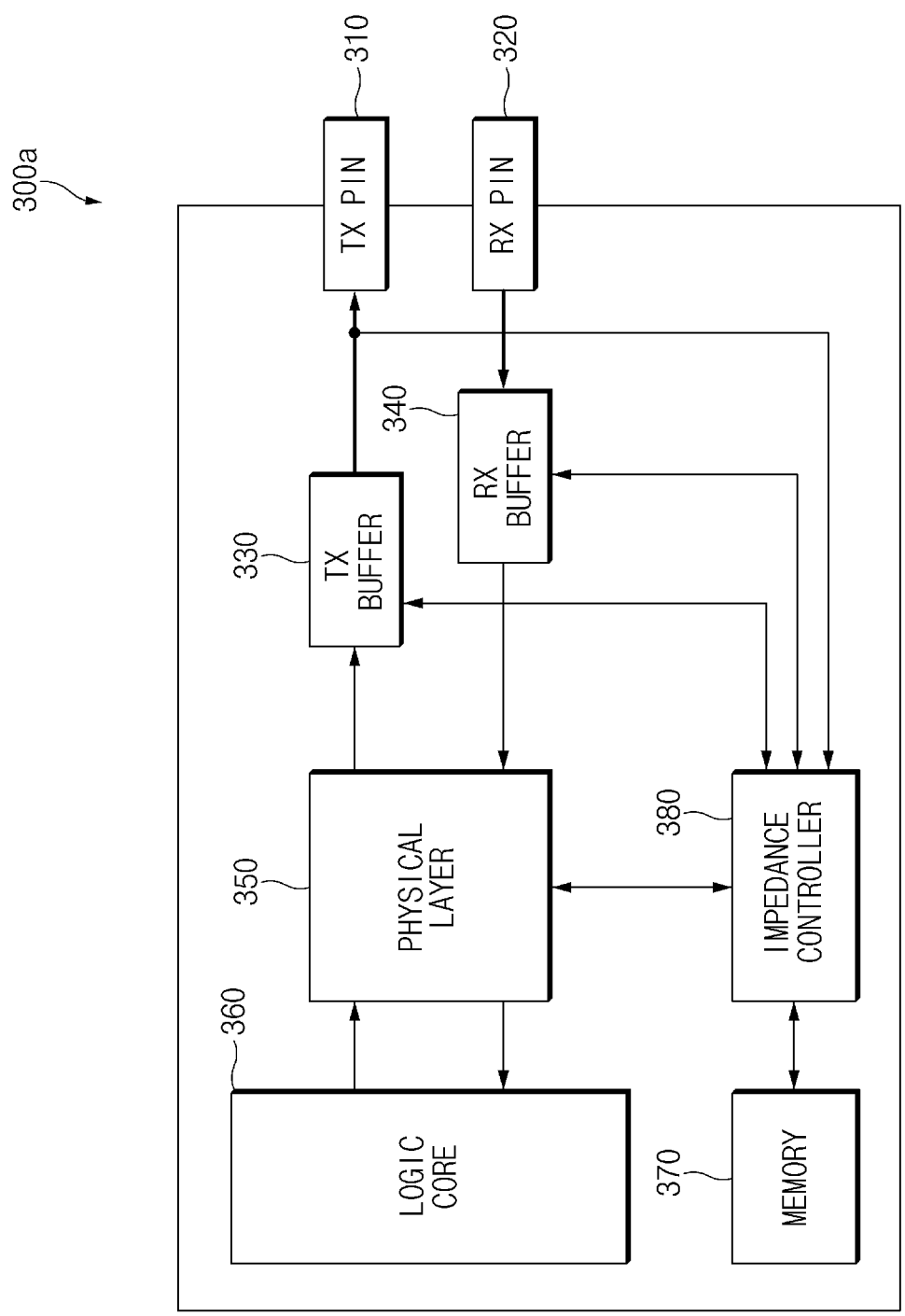
FIG. 3A illustrates a block diagram of an integrated circuit, according to an embodiment.

FIG. 3A illustrates a block diagram of an integrated circuit, according to an embodiment.

Referring to FIG. 3A, an integrated circuit 300a may include a transmit pin 310, a receive pin 320, a transmit buffer 330, a receive buffer 340, a physical layer 350, a logic core 360, a memory 370, and an impedance controller 380. According to certain embodiments, the integrated circuit 300a may not be limited to the components. For example, the integrated circuit 300a may further include a component not illustrated in FIG. 3A or may not include a part of the components illustrated in FIG. 3A. According to an embodiment, the integrated circuit 300a may be the first IC 220 or the second IC 230 illustrated in FIG. 2.

The integrated circuit 300a may include a transmit buffer 330 that includes a plurality of impedance elements. Changing of the impedance element may cause a change in the internal impedance. In certain embodiments, the impedance elements can have a wide range to allow matching of a particular determined impedance of the conducting wire. The impedance controller 380 can select the impedance element through a multiplexer. Similarly, the integrated circuit 300a includes a receive buffer with a plurality of impedance elements to match or approximate the impedance of the conducting wire.

The transmit pin 310 and the receive pin 320 may be input/output pins for transmitting or receiving a specified signal to or from any other integrated circuit. For example, the integrated circuit 300a may transmit information about an impedance of a conducting wire or information about a loss power due to the conducting wire to any other integrated circuit through the transmit pin 310. For another example, the integrated circuit 300a may receive the information from any other integrated circuit through the receive pin 320. According to an embodiment, the transmit pin 310 and the receive pin 320 may be combined.

According to an embodiment, the transmit pin 310 and the receive pin 320 may be electrically connected with at least one conducting wire included in a printed circuit board, for example, the first conducting wire 211 illustrated in FIG. 2. In certain embodiments, a voltage of a specified magnitude may be applied to the transmit pin 310. For example, a step signal having a magnitude of the first voltage may be applied to the transmit pin 310. For another example, a signal in which the step signal and a reflection signal due to the at least one conducting wire are mixed may be applied to the transmit pin 310 with the second voltage. For another example, a signal, in which only a direct current component remains, of the mixed signal may be applied to the transmit pin 310 with the third voltage.

Each of the transmit buffer 330 and the receive buffer 340 may include a plurality of impedance elements. For example, the transmit buffer 330 or the receive buffer 340 may include a plurality of impedance elements having different impedance values.

According to an embodiment, the transmit buffer 330 or the receive buffer 340 may select one of the plurality of impedance elements based on a specified signal provided from the impedance controller 380. In an embodiment, the one impedance element may be selected from the plurality of impedance elements so as to have the same value as an impedance value of the first conducting wire 211 illustrated in FIG. 2 or to have a value that is the most similar to the impedance value of the first conducting wire 211 In an embodiment, before the integrated circuit 300a obtains information about the impedance of the first conducting wire 211, the one impedance element may be selected from the plurality of impedance elements to have any value, for example, 50Ω. The selected impedance element may be electrically connected with the transmit pin 310 or the receive pin 320.

According to an embodiment, the transmit buffer 330 or the receive buffer 340 may include a single variable impedance element. For example, the transmit buffer 330 or the receive buffer 340 may allow an impedance value of the variable impedance element to be the same as the impedance value of the first conducting wire 211 based on a specified signal provided from the impedance controller 380.

The physical layer 350 may mean a layer that establishes, maintains, or disconnects a physical link for transferring data in compliance with a communication protocol. According to an embodiment, the physical layer 350 may encode a packet of data generated by the logic core 360 or may decode a packet of data received by the receive buffer 340. For example, the physical layer 350 may add data of pieces of information to be transmitted to any other integrated circuit to a transfer packet or may separate necessary information from a packet transmitted from the other integrated circuit.

The logic core 360 may perform a role of processing data received from the physical layer 350 and performing an operation for the purpose of transmitting the processed data to any other integrated circuit. The processed data may be provided to the physical layer 350.

The memory 370 may store instructions for operations of the impedance controller 380. For example, the instructions may include an instruction for an operation of calculating an impedance of a conducting wire included in the printed circuit board 210, an instruction for an operation of changing an internal impedance based on the calculated impedance, or an instruction for an operation of transmitting information about the calculated impedance to any other integrated circuit.

Based on the instructions stored in the memory 370, the impedance controller 380 may control operations of the components included in the integrated circuit 300a or may perform an operation that is based on data obtained from the components. According to an embodiment, the impedance controller 380 may control the transmit buffer 330 or the receive buffer 340 such that one of the plurality of impedances included in the transmit buffer 330 or the receive buffer 340 is selected. According to an embodiment, the impedance controller 380 may generate a specified signal and may provide the generated signal to the transmit buffer 330. According to an embodiment, the impedance controller 380 may measure a voltage of the transmit pin 310 at at least one time point. According to an embodiment, the impedance controller 380 may optimize the transmission power of the integrated circuit 300a. The operations of the impedance controller 380 will be more fully described with reference to FIGS. 6 to 8.

Figure 3B:
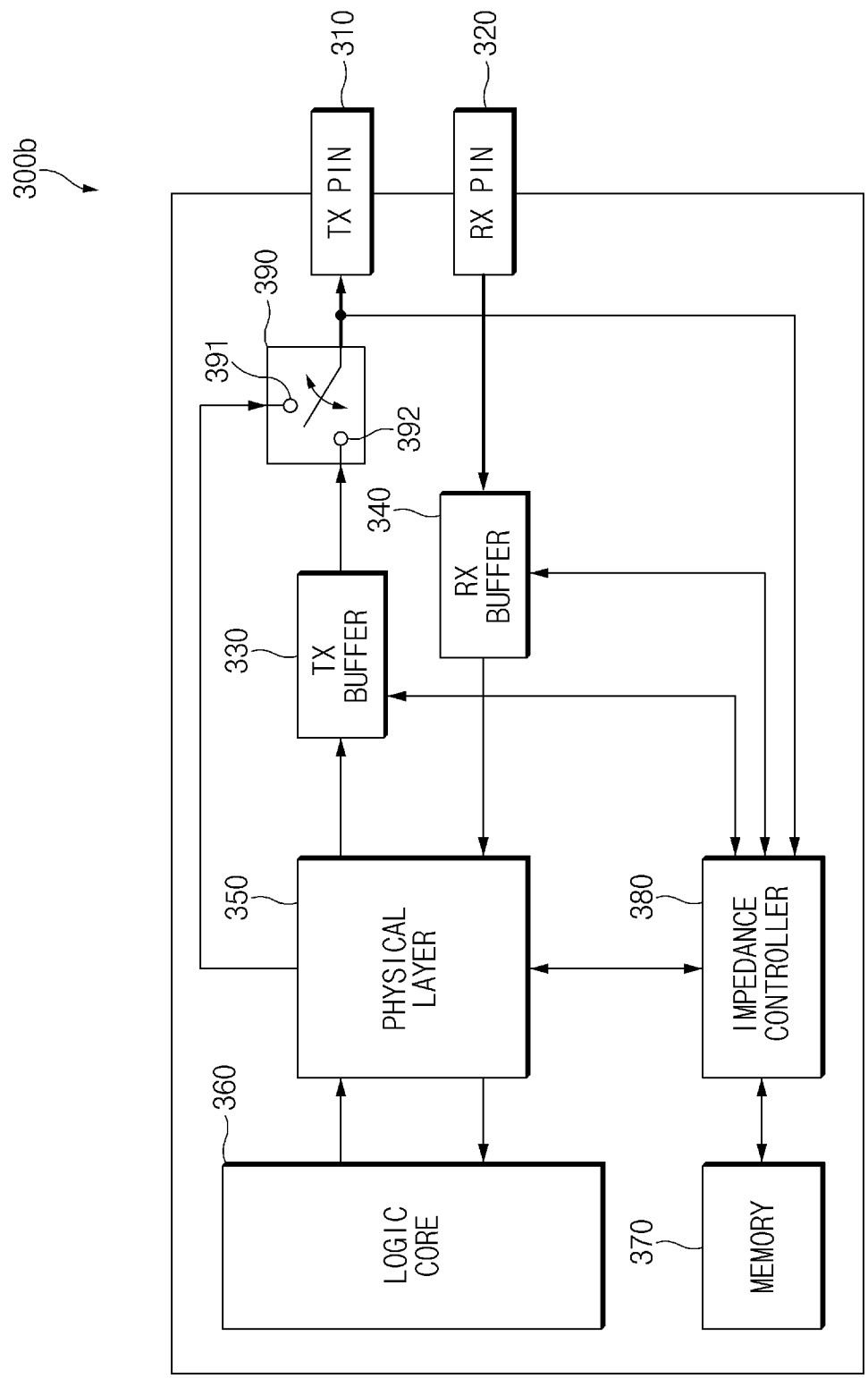
FIG. 3B illustrates a block diagram of an integrated circuit, according to another embodiment.

FIG. 3B illustrates a block diagram of an integrated circuit, according to another embodiment.

Referring to FIG. 3B, an integrated circuit 300b may include the transmit pin 310, the receive pin 320, the transmit buffer 330, the receive buffer 340, the physical layer 350, the logic core 360, the memory 370, the impedance controller 380, and a switch 390. According to certain embodiments, the integrated circuit 300b may not be limited to the components. For example, the integrated circuit 300a may further include a component not illustrated in FIG. 3B or may not include a part of the components illustrated in FIG. 3B. According to an embodiment, the integrated circuit 300b may be the first IC 220 or the second IC 230 illustrated in FIG. 2. In FIG. 3B, with regard to the description given with reference to FIG. 3A, additional description will be omitted to avoid redundancy.

According to an embodiment, the integrated circuit 300b may transmit a signal through a plurality of signal transfer paths. For example, before the integrated circuit 300b obtains information about an impedance of a conducting wire electrically connected with the transmit pin 310, for example, the first conducting wire 211 illustrated in FIG. 2, the integrated circuit 300b may transmit a test signal for obtaining the information through a first path. The first path may be an electrical path through which a signal is transmitted from the impedance controller 380 to the transmit pin 310 through the physical layer 350 and the switch 390 without passing through the transmit buffer 330. According to an embodiment, on the first path, a default impedance, for example, an internal impedance of 50Ω to be formed between the physical layer 350 and the switch 390 may be included.

For another example, after obtaining the information, the integrated circuit 300b may transmit a specified signal through a second path based on the information. The second path may be an electrical path through which a signal is transmitted from the impedance controller 380 to the transmit pin 310 through the physical layer 350, the transmit buffer 330, and the switch 390. According to an embodiment, on the second path, the transmit buffer 330 may select one impedance, which is based on the information, from among a plurality of impedances.

The switch 390 may electrically connect the transmit pin 310 with one of a first terminal 391 and a second terminal 392 such that one path of a plurality of paths, for example, the first path and the second path is selected. For example, when the integrated circuit 300b intends to transmit a test signal for the purpose of obtaining information about the impedance of the first conducting wire 211, the switch 390 may electrically connect the first terminal 391 and the transmit pin 310. For another example, when the integrated circuit 300b intends to determine an internal impedance based on the obtained information and to transmit a specified signal, the switch 390 may electrically connect the second terminal 392 and the transmit pin 310. According to certain embodiments, the switch 390 may be controlled by the impedance controller 380.

Figure 4A:
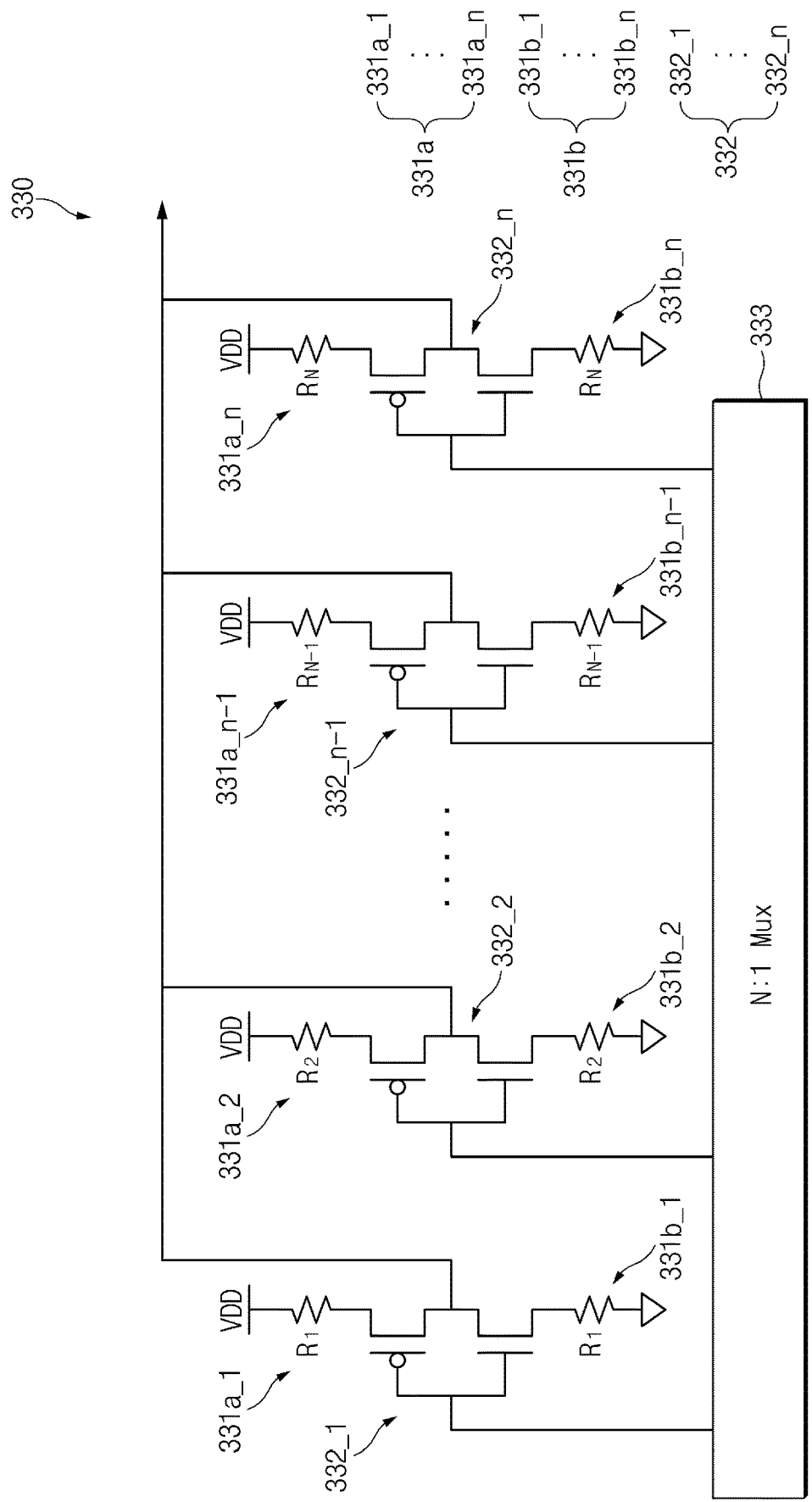
FIG. 4A illustrates a circuit diagram of a transmit buffer, according to an embodiment.

FIG. 4A illustrates a circuit diagram of a transmit buffer, according to an embodiment. One of the plurality of impedance elements 331a and 331b can be selected by a demultiplexer 333. The demultiplexer 333 can select the one of the impedance elements 331a and 331b with a control signal from the impedance controller 380.

Referring to FIG. 4A, the transmit buffer 330 may include a plurality of impedance elements 331a and 331b, a plurality of switches 332, and a demultiplexer 333.

The impedance elements includes resistors pairs $R_1$, $R_2$ ... $R_N$, and switches 332_1 ... 332_n. The values of the resistors can have a range of values, thereby allowing the internal impedance to have a similar range of values. The switches 332_1 ... 332_n control whether the corresponding impedance element is selected. The switches are configured such that only one can be selected.

According to certain embodiments, the transmit buffer 330 is not limited to the configuration illustrated in FIG. 4A. In certain embodiments, the transmit buffer 330 may be implemented with various circuits capable of changing an internal impedance of an integrated circuit depending on a randomly set impedance value. For example, the transmit buffer 330 may include a variable impedance element.

The plurality of impedance elements 331a and 331b may be respectively connected with a reference voltage VDD and a ground to implement one circuit. The circuits thus implemented may conduct electricity or may not conduct electricity with the plurality of switches 332, respectively.

According to an embodiment, the plurality of impedance elements 331a and 331b may have different impedance values. For example, the plurality of impedance elements 331a and 331b may have values that are greater or smaller than a standard impedance of a printed circuit board, for example, 50Ω. In this case, even the actual impedance of the conducting wire varies from the design impedance, at least one impedance element may have an impedance value that is the same as or similar to an impedance of a conducting wire (e.g., the first conducting wire 211).

For example, the IC can be connected to the impedance element, for example 331a_1, 332b_1, having the standard and expected impedance, 50Ω. Accordingly the demultiplexer outputs a signal selecting switch 332_1. However, the actual impedance of the conducting wire is 70Ω. The impedance controller 380 can send a signal to the demultiplexer selecting a different impedance element, for example, 331a_2, 331b_2 that has 70Ω resistance.

The plurality of switches 332 may be configured such that only one switch is turned on by the demultiplexer 333. According to an embodiment, when the one switch is turned on, the remaining switches may be turned off, and only one circuit may conduct electricity with the turned-on switch.

The demultiplexer 333 may control the plurality of switches 332 based on a control signal of an impedance controller (e.g., the impedance controller 380 of FIG. 3A). For example, the impedance controller may obtain an internal impedance value minimizing a reflection signal based on the calculated impedance of the conducting wire and may provide the control signal to the demultiplexer 333 such that a circuit including impedance corresponding to the internal impedance value conducts electricity. The demultiplexer 333 may turn on a switch of the circuit including the impedance corresponding to the internal impedance value based on the control signal.

According to an embodiment, the transmit buffer 330 may optimize a transmission power of a signal to be transmitted. For example, the transmit buffer 330 may change the reference voltage VDD under control of the impedance controller. In an embodiment, the impedance controller may obtain a DC loss voltage due to a conducting wire included in a printed circuit board and may increase the reference voltage VDD as much as the obtained DC loss voltage.

Figure 4B:
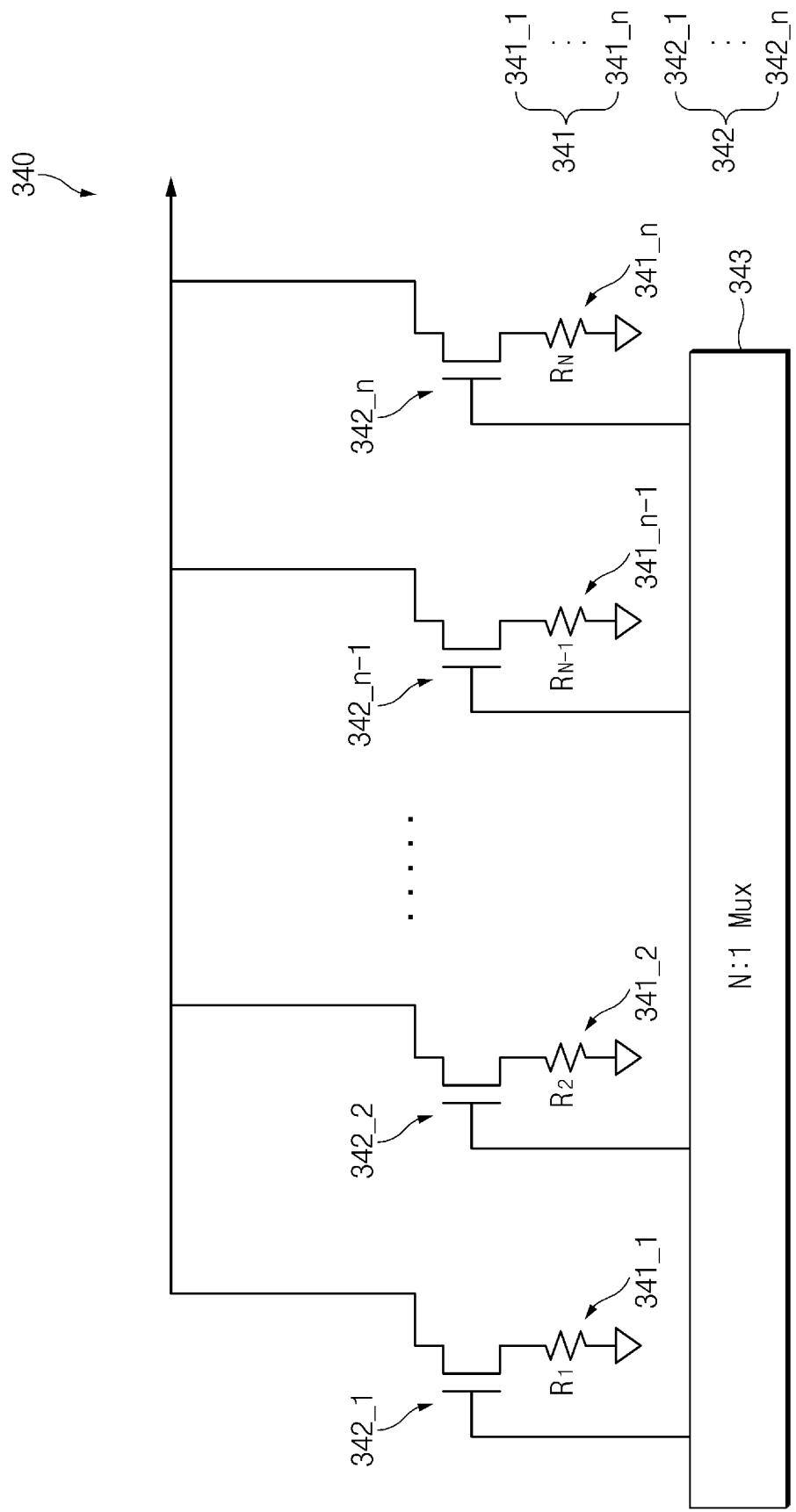
FIG. 4B illustrates a circuit diagram of a receive buffer, according to an embodiment.

FIG. 4B illustrates a circuit diagram of a receive buffer, according to an embodiment.

Referring to FIG. 4B, the receive buffer 340 may include a plurality of impedance elements 341, a plurality of switches 342, and a demultiplexer 343. According to certain embodiments, the receive buffer 340 is not limited to the configuration illustrated in FIG. 4B. In certain embodiments, the receive buffer 340 may be implemented with various circuits capable of changing an internal impedance of an integrated circuit depending on a randomly set impedance value. For example, the receive buffer 340 may include a variable impedance element.

Each of the plurality of impedance elements 341 may be connected with a ground to implement one circuit. The circuits thus implemented may conduct electricity or may not conduct electricity with the plurality of switches 342, respectively.

According to an embodiment, the plurality of impedance elements 341 may have different impedance values. For example, the plurality of impedance elements 341 may have values that are greater or smaller than a standard impedance of a printed circuit board, for example, 50Ω. In this case, even though an error occurs in the standard impedance, at least one impedance element may have an impedance value that is the same as or similar to an impedance of a conducting wire (e.g., the first conducting wire 211).

The plurality of switches 342 may be configured such that only one switch is turned on by the demultiplexer 343. According to an embodiment, when the one switch is turned on, the remaining switches may be turned off, and only one circuit may conduct electricity with the turned-on switch.

The demultiplexer 343 may control the plurality of switches 342 based on a control signal of an impedance controller (e.g., the impedance controller 380 of FIG. 3A). For example, the impedance controller may obtain an internal impedance value minimizing a reflection signal based on information received from a transmitter IC. The impedance controller may provide a control signal to the demultiplexer 343 such that a circuit including impedance corresponding to the internal impedance value conducts electricity. The demultiplexer 343 may turn on a switch of the circuit including the impedance corresponding to the internal impedance value based on the control signal.

According to an embodiment, the receive buffer 340 may further include at least one amplifier circuit. For example, the at least one amplifier circuit may be added to an output terminal of the receive buffer 340. According to an embodiment, the at least one amplifier circuit may amplify a received signal for the purpose of compensating for a DC loss voltage due to a conducting wire included in a printed circuit board.

In certain embodiments, the impedance of the conducting wire may include a phase-altering portion.

Figure 5:
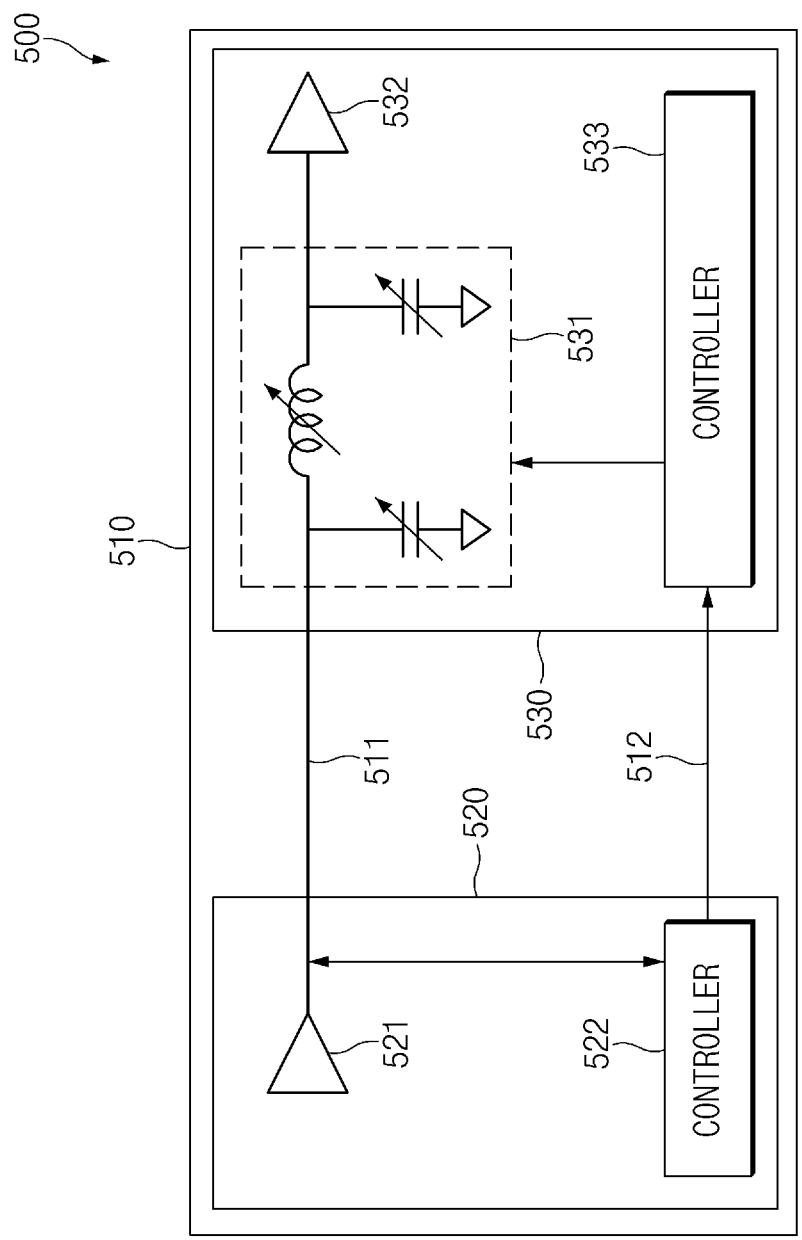
FIG. 5 illustrates a block diagram of an electronic device, according to an embodiment.

FIG. 5 illustrates a block diagram of an electronic device, according to an embodiment.

Referring to FIG. 5, an electronic device 500 may include integrated circuits transmitting a radio frequency (RF) signal. For example, the electronic device 500 may include a printed circuit board 510, a first IC 520 mounted on the printed circuit board 510, and a second IC 530.

According to certain embodiments, the first IC 520 and the second IC 530 may exchange both a digital signal and an RF signal with each other. For example, the first IC 520 may transmit an RF signal to the second IC 530 through a first conducting wire 511 and may transmit a digital signal, for example, a data signal to the second IC 530 through a second conducting wire 512.

According to an embodiment, the first IC 520 may include an RF driver 521 and a controller 522. According to an embodiment, the RF driver 521 may generate an RF signals, may amplify the RF signal with a specified intensity, and may transmit the amplified signal to any other integrated circuit, for example, the second IC 530. According to an embodiment, the controller 522 may be the same as or similar to the impedance controller 380 illustrated in FIG. 3A. In an embodiment, the controller 522 may obtain an impedance of the first conducting wire 511 or the second conducting wire 512 and may change an internal impedance of the first IC 520 such that the impedance and the internal impedance of the first IC 520 are matched.

According to an embodiment, the controller 522 may transmit information about the impedance of the first conducting wire 511 or the second conducting wire 512 to the second IC 530, for example, to a controller 533 of the second IC 530 through the second conducting wire 512.

According to an embodiment, the second IC 530 may include an impedance block 531, an RF receiver 532, and the controller 533. According to an embodiment, the RF receiver 532 may receive an RF signal from any other integrated circuit, for example, the first IC 520 and may amplify the received signal with a specified intensity. According to an embodiment, the impedance block 531 may be a component for matching the impedance of the first conducting wire 511 and an internal impedance of the second IC 530.

According to an embodiment, in the case of transmitting an RF signal, the impedance of the first conducting wire 511 may include a phase changing portion (which is mathematically represented as sqrt(−1) or an imaginary part). Accordingly, the impedance block 531 may be implemented to include a resistor, or alternatively/additionally at least one of a variable inductor and a variable capacitor for the portion of the phase changing portion of the impedance. According to an embodiment, the controller 533 may be the same as or similar to the impedance controller 380 illustrated in FIG. 3A. In an embodiment, the controller 533 may receive information about the impedance of the first IC 520 or the second conducting wire 512 from the first IC 520, for example, the controller 522 of the first IC 520 through the second conducting wire 512. In another embodiment, the first IC 520 may transmit a signal capable of identifying an impedance characteristic of the first conducting wire 511.

The controller 533 of the second IC 530 may determine the information about the first conducting wire 511 based on the signal transmitted from the first IC 520 to the second IC 530. The controller 533 may control the impedance block 531 based on the received information or the determined information such that impedance matching, including the phase altering component, with the first conducting wire 511 or the second conducting wire 512 is made.

According to certain embodiments, an example is illustrated in FIG. 5 as the impedance block 531 is included only in the second IC 530, but the disclosure is not limited thereto. For example, unlike the example of FIG. 5, the impedance block 531 may be included only in the first IC 520 or may be included in each of the first IC 520 and the second IC 530. In this case, the description given with reference to the impedance block 531 may be identically or similarly applied to an impedance block included in the first IC 520.

Figure 6A:
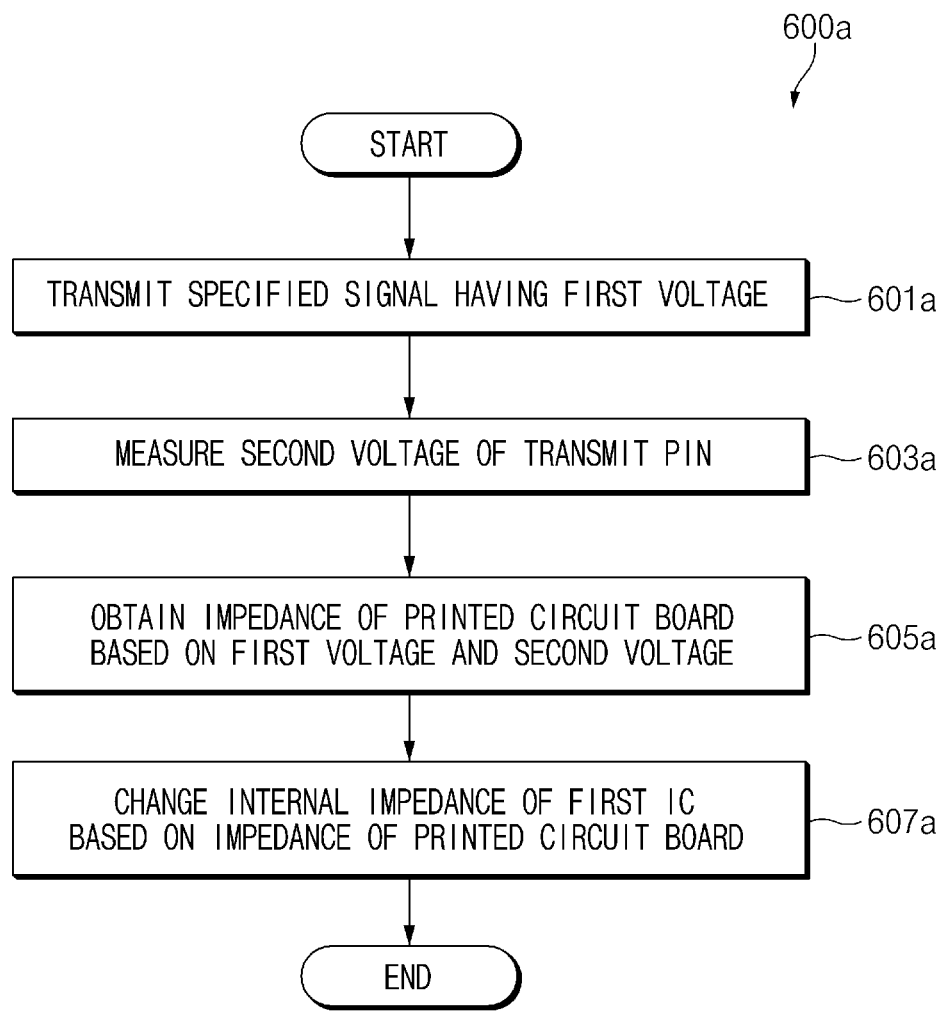
FIG. 6A illustrates a flowchart for a method of changing an internal impedance of a first IC depending on an impedance of a conducting wire included in a printed circuit board at an electronic device, according to an embodiment.

FIG. 6A illustrates a flowchart for a method in which an electronic device changes an internal impedance of a first IC depending on an impedance of a conducting wire included in a printed circuit board, according to an embodiment.

Referring to FIG. 6A, a method 600a of changing an internal impedance of a first IC based on an impedance of a conducting wire included in a printed circuit board may include operation 601a to operation 607a. According to an embodiment, it may be understood that operation 601a to operation 607a are performed by a transmitter IC, for example, the first IC 220 illustrated in FIG. 2 or the integrated circuit 300a illustrated in FIG. 3A.

In operation 601a, the first IC may transmit a specified signal having the first voltage. According to an embodiment, the first IC may generate a specified signal and may provide the generated signal having the first voltage to a transmit pin (e.g., the transmit pin 310). For example, the first IC may generate a step signal having an amplitude of the first voltage and may apply the generated signal to the transmit pin such that the generated signal is transmitted to the outside.

According to an embodiment, the first IC may select one impedance element of a plurality of impedance elements included in a transmit buffer (e.g., the transmit buffer 330 of FIG. 3A). For example, the first IC may control the transmit buffer such that an impedance to be matched with a standard impedance of a printed circuit board becomes an internal impedance.

In operation 603a, the first IC may measure the second voltage of the transmit pin. For example, the first IC may perform operation 601a at a first time point and may measure the second voltage of the transmit pin at a second time point that is within a specified time after the first time point.

According to an embodiment, the first IC may measure a voltage of the transmit pin. For example, the first IC may include at least one analog digital converter (ADC) included in an impedance controller (e.g., the impedance controller 380 of FIG. 3A) and may measure a voltage of the transmit pin by using the ADC.

According to an embodiment, immediately after a specified signal of the first voltage is applied to the transmit pin, for example, at the second time point, a reflection signal may occur due to a conducting wire included in a printed circuit board. The reflection signal may occur because the impedance of the conducting wire is not matched with the internal impedance of the first IC, thereby causing an increase or decrease in the magnitude of the first voltage transmitted from the first IC. The voltage of the transmit pin at the second time point may be referred to as a "second voltage".

In operation 605a, the first IC may obtain the impedance of the conducting wire included in the printed circuit board based on the first voltage and the second voltage. For example, the impedance of the conducting wire may be expressed by $$\frac{V2}{V1-V2} \times Z_o.$$

"V1" may represent the first voltage, and "V2" may represent the second voltage. "Zo" may be an internal impedance initially set, for example, an internal impedance when the first voltage is applied and the second voltage is measured.

In operation 607a, the first IC may change the internal impedance based on the impedance of the conducting wire included in the printed circuit board. According to an embodiment, the first IC may select an impedance element, which is matched with the impedance of the conducting wire measured in operation 605a, from among the plurality of impedance elements included in the transmit buffer as the internal impedance.

According to an embodiment, the first IC may transmit information about the impedance of the conducting wire included in the printed circuit board to the second IC. The second IC may change an internal impedance based on the information, in a way that is the same as or similar to a way to change the internal impedance of the first IC.

An electronic device may minimize a reflection signal between an integrated circuit and a printed circuit board through operation 601a to operation 607a. According to an embodiment, operation 601a to operation 607a may be performed whenever a power of the electronic device is turned on and settings are initialized.

According to another embodiment, operation 601a to operation 607a may be performed at a specified time interval, for example, every several months. For another example, operation 601a to operation 607a may be performed based on a change of an ambient environment of the electronic device. For example, operation 601a to operation 607a may be performed when the electronic device detects a sharp temperature change. As such, the electronic device may adaptively cope with a change in an impedance of a conducting wire included in the printed circuit board.

Figure 6B:
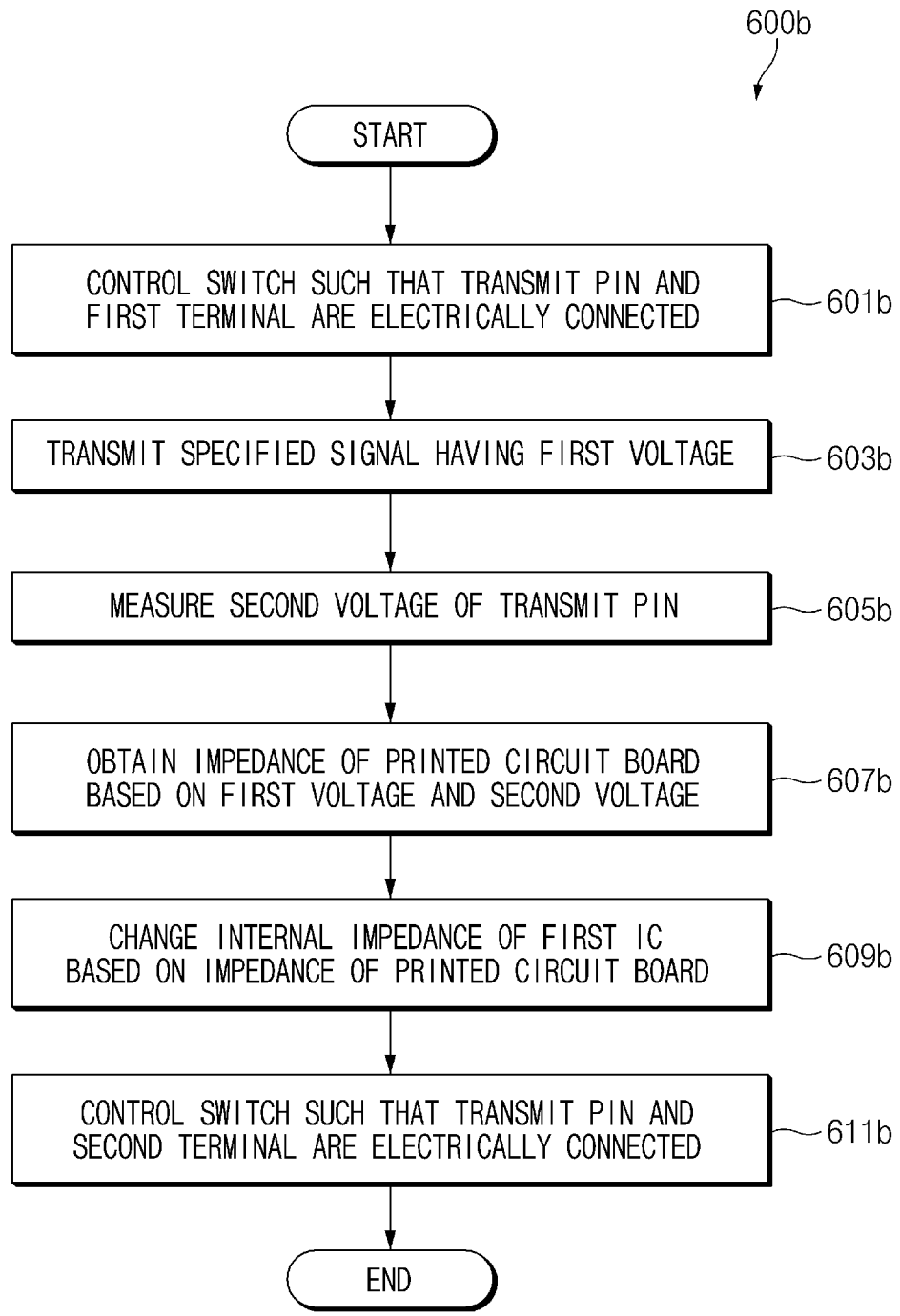
FIG. 6B illustrates a flowchart for a method in which an electronic device changes an internal impedance of a first IC depending on an impedance of a conducting wire included in a printed circuit board, according to another embodiment.

FIG. 6B illustrates a flowchart for a method in which an electronic device changes an internal impedance of a first IC depending on an impedance of a conducting wire included in a printed circuit board, according to another embodiment.

Referring to FIG. 6B, a method 600b of changing an internal impedance of a first IC depending on an impedance of a conducting wire included in a printed circuit board may include operation 601b to operation 611b. According to an embodiment, it may be understood that operation 601b to operation 611b are performed by a transmitter IC, for example, the first IC 220 illustrated in FIG. 2 or the integrated circuit 300b illustrated in FIG. 3B. In FIG. 6B, with regard to the description given with reference to FIG. 6A, additional description will be omitted to avoid redundancy.

In operation 601b, the first IC may control a switch (e.g., the switch 390 of FIG. 3B) such that a transmit pin (e.g., the transmit pin 310 of FIG. 3B) and a first terminal (e.g., the first terminal 391 of FIG. 3B) are electrically connected. The first terminal may be an internal switch terminal forming an electrical path for transmitting a test signal. In an embodiment, an internal impedance of the first IC formed by the electrical path may be a default impedance, for example, 50Ω. In an embodiment, the transmit pin may be electrically connected with a physical layer (e.g., the physical layer 350 of FIG. 3B) through operation 601b.

In operation 603b, the first IC may transmit a specified signal having the first voltage through the electrical path formed in operation 601b. For example, operation 603b may be the same as or similar to operation 601a illustrated in FIG. 6A. However, in this case, the first IC may not select one impedance element of a plurality of impedance elements included in a transmit buffer (e.g., the transmit buffer 330 of FIG. 3B). For example, because the first IC transmits the specified signal through the separate electrical path that is formed in operation 601b and does not include the transmit buffer, it may be unnecessary to control the transmit buffer.

According to certain embodiments, operation 605b to operation 609b may be the same as or similar to operation 603a to operation 607b illustrated in FIG. 6A. For example, in operation 605b, the first IC may measure the second voltage of the transmit pin; in operation 607b, the first IC may obtain an impedance of a conducting wire included in a printed circuit board based on the first voltage and the second voltage. For another example, in operation 609b, the first IC may change the internal impedance based on the impedance of the conducting wire included in the printed circuit board.

In operation 611b, the first IC may control a switch such that the transmit pin and the second terminal are electrically connected. The second terminal may be an internal switch terminal forming an electrical path for transmitting a specified signal by using the internal impedance determined in operation 609b. In an embodiment, the transmit pin may be electrically connected with the transmit buffer through operation 611b.

An electronic device may minimize a reflection signal between an integrated circuit and a printed circuit board through operation 601b to operation 611b. According to an embodiment, operation 601b to operation 611b may be performed whenever a power of the electronic device is turned on and settings are initialized. According to another embodiment, operation 601b to operation 611b may be performed at a specified time interval, for example, every several months. For another example, operation 601b to operation 611b may be performed based on a change of an ambient environment of the electronic device. For example, operation 601b to operation 611b may be performed when the electronic device detects a sharp temperature change. As such, the electronic device may adaptively cope with a change in an impedance of a conducting wire included in the printed circuit board.

Figure 7:
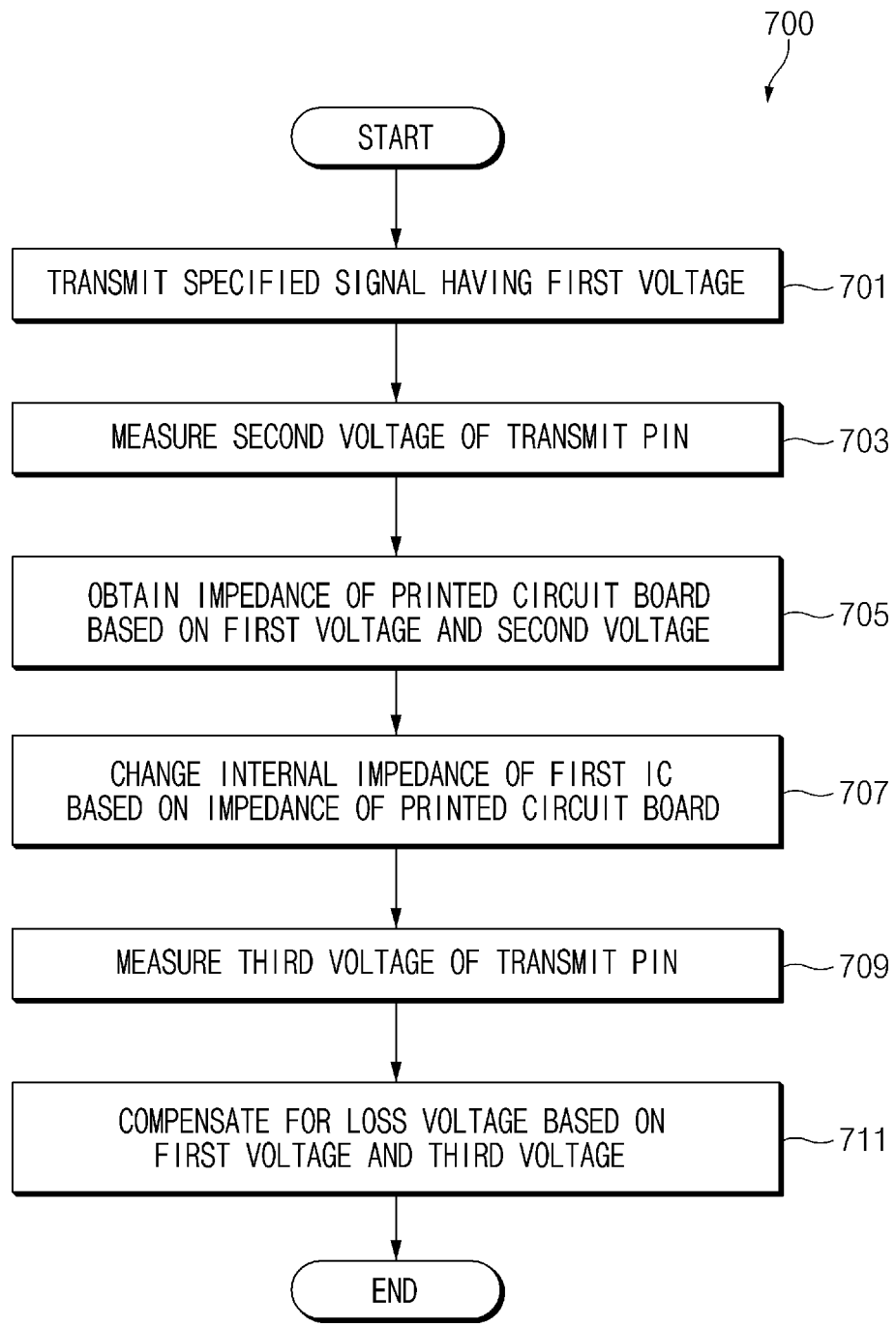
FIG. 7 illustrates a flowchart for a method in which an electronic device changes an internal impedance of a first IC and compensates for a loss voltage, depending on an impedance of a conducting wire included in a printed circuit board, according to an embodiment.

FIG. 7 illustrates a flowchart for a method in which an electronic device changes an internal impedance of a first IC and compensates for a loss voltage, depending on an impedance of a conducting wire included in a printed circuit board, according to an embodiment.

Referring to FIG. 7, a method 700 of changing an internal impedance of a first IC and compensating for a loss voltage depending on an impedance of a conducting wire included in a printed circuit board may include operation 701 to operation 711. According to an embodiment, it may be understood that operation 701 to operation 711 are performed by a transmitter IC, for example, the first IC 220 illustrated in FIG. 2. Operation 701 to operation 707 are the same as or similar to operation 601a to operation 607b illustrated in FIG. 6A, and thus, additional description will be omitted to avoid redundancy.

In operation 709, the first IC may measure the third voltage of a transmit pin. For example, the first IC may measure a voltage of the transmit pin by using at least one ADC. According to an embodiment, when a specified signal having the first voltage is applied to the transmit pin in operation 701, a reflection signal may occur due to a conducting wire included in a printed circuit board. When a specific time elapses, an AC component may be completely converged, and only a DC component may remain at the transmit pin. The first IC may measure the third voltage of the transmit pin at which only the DC component remains. According to an embodiment, a magnitude of the third voltage may be smaller than a magnitude of the first voltage.

In operation 711, the first IC may compensate for a loss voltage based on the first voltage and the third voltage. For example, the first IC may calculate the loss voltage based on the first voltage and the third voltage. For example, the loss voltage may be calculated by $$\frac{(R_1 + R_2)(V3 - V1)}{2V1 - V3}.$$

"V1" may represent the first voltage, and "V3" may represent the third voltage. "R1" may represent an internal impedance of the first IC, that is, a transmitter IC, and "R2" may represent an internal impedance of a second IC, that is, a receiver IC.

According to an embodiment, the first IC may change the reference voltage VDD included in the transmit buffer. For example, the first IC may increase the reference voltage VDD as much as a magnitude of the calculated loss voltage.

According to an embodiment, the first IC may transmit information about the loss voltage of the printed circuit board to the second IC. The second IC may compensate for a loss voltage in a way that is the same as or similar to a way to compensate for the loss voltage of the first IC.

Through operation 701 to operation 711, an electronic device may minimize a reflection signal between an integrated circuit and a printed circuit board and may compensate for a loss of a transmission power. According to an embodiment, operation 701 to operation 711 may be performed whenever a power of the electronic device is turned on and settings are initialized. According to another embodiment, operation 701 to operation 711 may be performed at a specified time interval, for example, every several months. For another example, operation 701 to operation 711 may be performed based on a change of an ambient environment of the electronic device. For example, operation 701 to operation 711 may be performed when the electronic device detects a sharp temperature change. As such, the electronic device may adaptively cope with a change in an impedance of a conducting wire included in the printed circuit board.

Figure 8:
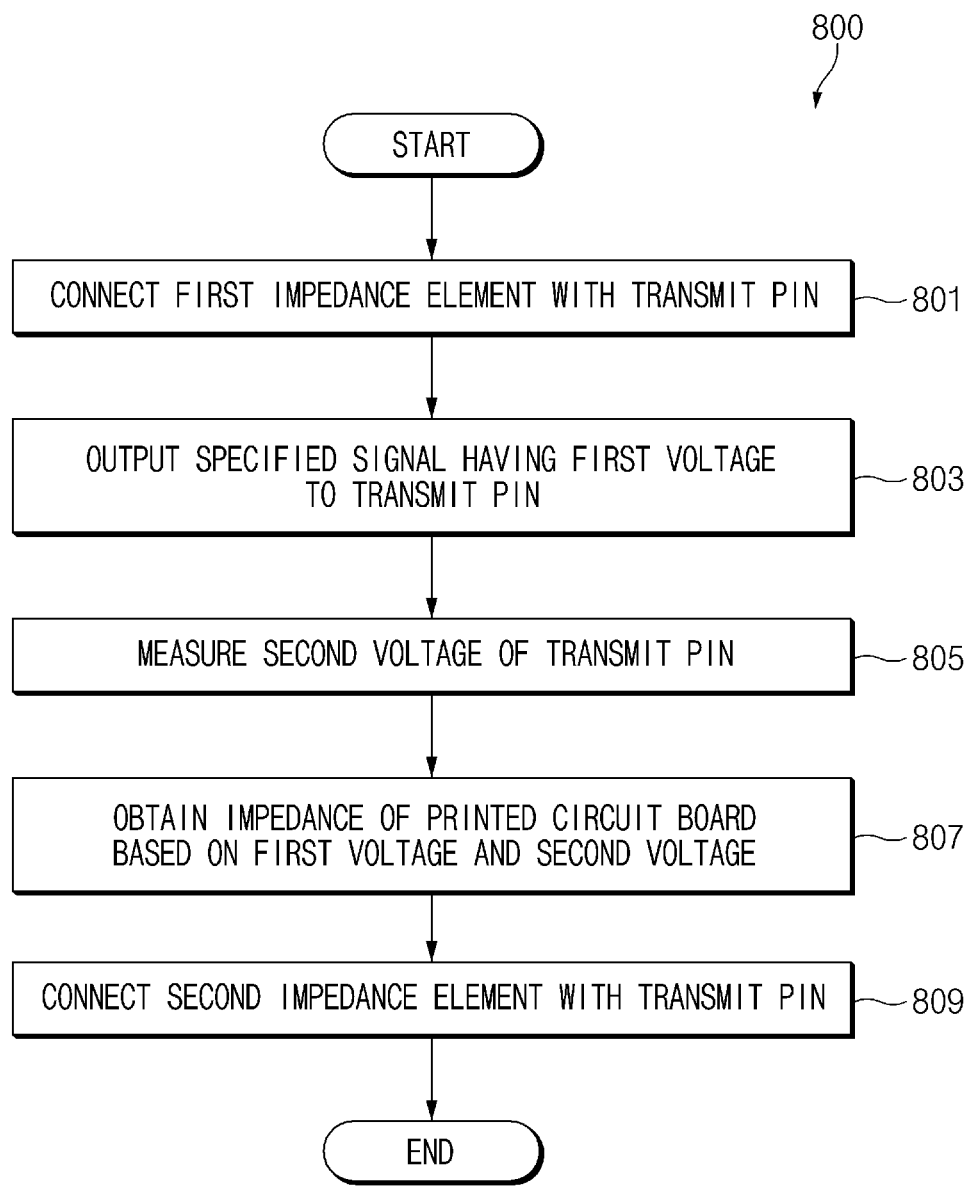
FIG. 8 illustrates a flowchart for a method in which an electronic device changes an internal impedance depending on an impedance of a conducting wire included in a printed circuit board, according to an embodiment.

FIG. 8 illustrates a flowchart for a method in which an electronic device changes an internal impedance depending on an impedance of a conducting wire included in a printed circuit board, according to an embodiment.

Referring to FIG. 8, a method 800 of changing internal impedance depending on an impedance of a conducting wire included in a printed circuit board may include operation 801 to operation 809. According to an embodiment, it may be understood that operation 801 to operation 809 are performed by an impedance controller (e.g., the impedance controller 380 of FIG. 3A) included in an integrated circuit.

In operation 801, the impedance controller may connect a first impedance element with a transmit pin. For example, the first impedance element may have an impedance value capable of being matched with a standard impedance of a printed circuit board. For another example, the first impedance element may have simply any impedance value. Through operation 801, an internal impedance of the integrated circuit, for example, an output impedance may have an impedance value of the first impedance element.

In operation 803, the impedance controller may output a specified signal having a first voltage to the transmit pin. For example, the impedance controller may generate a step signal having an amplitude of the first voltage and may apply the generated signal to the transmit pin such that the generated signal is transmitted to the outside.

In operation 805, the impedance controller may measure the second voltage of the transmit pin. For example, the impedance controller may perform operation 803 at a first time point and may measure the second voltage of the transmit pin at a second time point that is within a specified time after the first time point. According to an embodiment, the impedance controller may include at least one analog digital converter (ADC) and may measure a voltage of the transmit pin by using the ADC. In an embodiment, at the second time point, impedance matching with the conducting wire included in the printed circuit board may not be made, and thus, the second voltage may include a reflection signal of the conducting wire.

In operation 807, the impedance controller may obtain an impedance of the conducting wire included in the printed circuit board based on the first voltage and the second voltage. For example, the impedance of the conducting wire may be expressed by $$\frac{V2}{V1 - V2} \times Z_o.$$

"V1" may represent the first voltage, and "V2" may represent the second voltage. "Zo" may be an internal impedance initially set, for example, a first impedance set in operation 801.

In operation 809, the impedance controller may connect a second impedance element with the transmit pin. The second impedance element may be, for example, an impedance element, which may be matched with the impedance (obtained in operation 807) of the conducting wire included in the printed circuit board, from among a plurality of impedance elements included in the transmit buffer. According to an embodiment, when the second impedance element is connected with the transmit pin, an internal impedance of an integrated circuit, that is, an output impedance may have an impedance value of the second impedance element. As such, impedance matching may be made between the integrated circuit and the conducting wire of the integrated circuit.

The integrated circuit may minimize a reflection signal of the printed circuit board through operation 801 to operation 809. According to an embodiment, operation 801 to operation 809 may be performed whenever a power of the electronic device is turned on and settings are initialized. According to another embodiment, operation 801 to operation 809 may be performed at a specified time interval, for example, every several months. For another example, operation 801 to operation 809 may be performed based on a change of an ambient environment of the electronic device. For example, operation 801 to operation 809 may be performed when the electronic device detects a sharp temperature change. As such, the integrated circuit may adaptively cope with a change in an impedance of a conducting wire included in the printed circuit board.

Figure 9A:
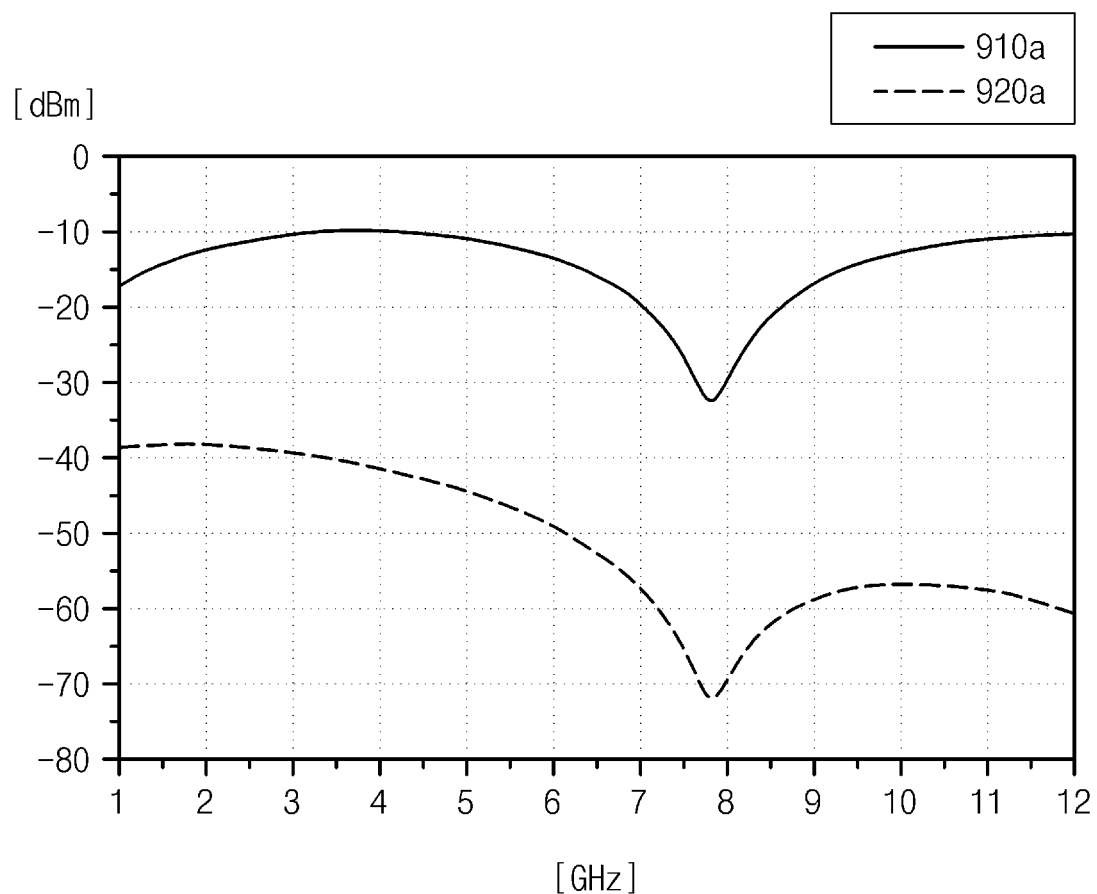
FIG. 9A illustrates the intensity of reflection component for each frequency at an electronic device, according to certain embodiments.
Figure 9B:
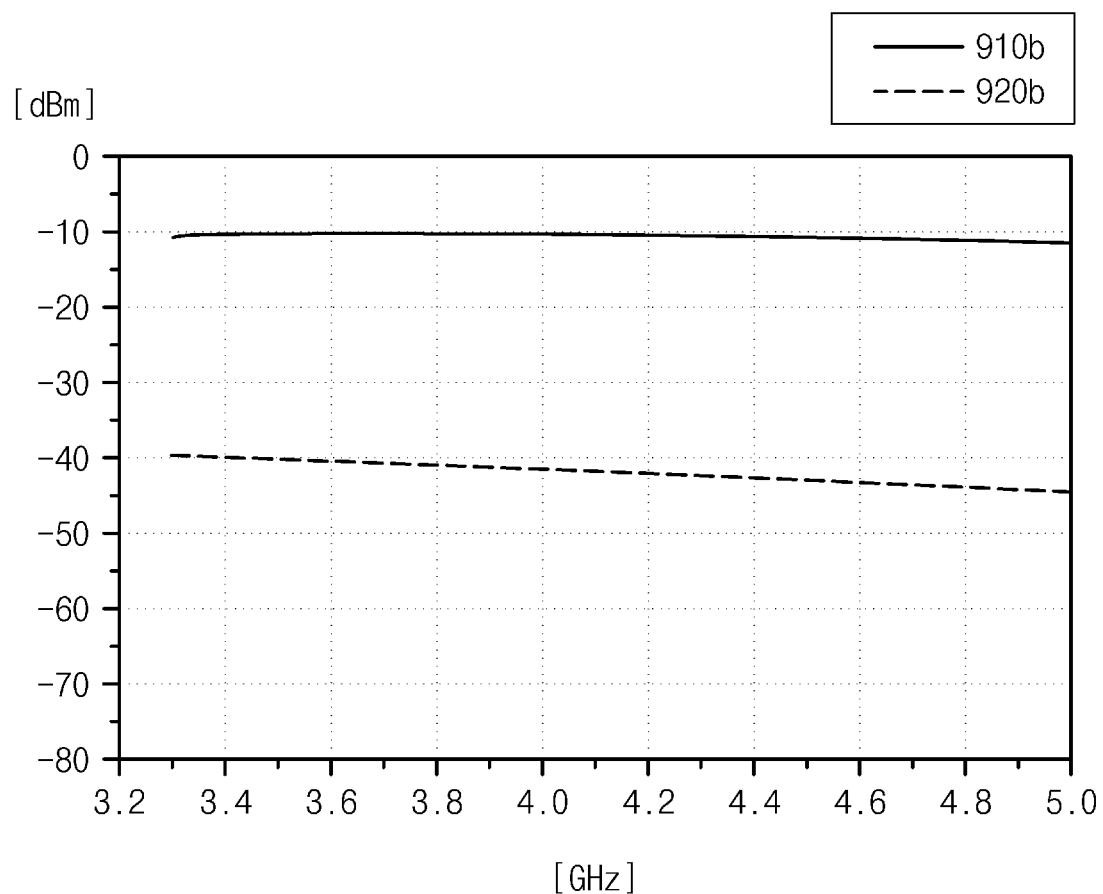
FIG. 9B illustrates the intensity of reflection component for each frequency at an electronic device, according to certain embodiments.
Figure 9C:
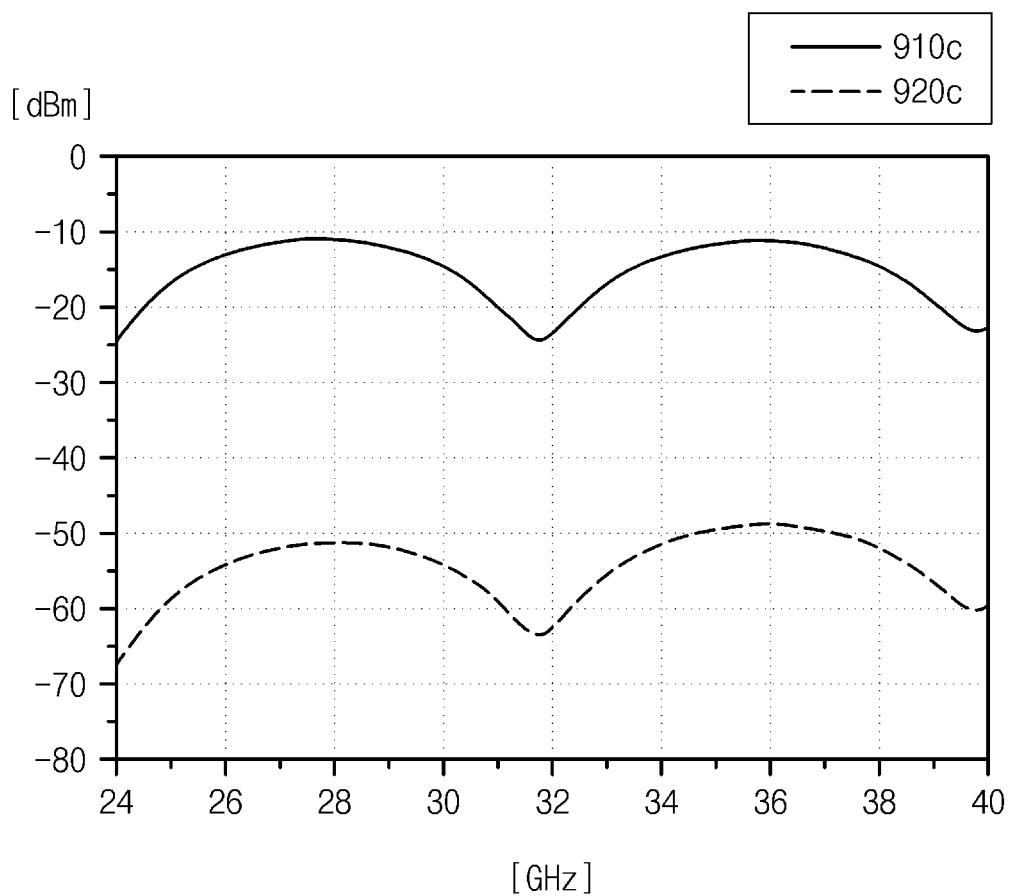
FIG. 9C illustrates the intensity of reflection component for each frequency at an electronic device, according to certain embodiments.

FIGS. 9A to 9C illustrate the intensity of reflection signal as measured in decibel milliwatts for a variety of frequencies at an electronic device, according to certain embodiments.

It may be observed from FIGS. 9A to 9C that the intensity of reflection signal varies depending on a frequency in the case of transmitting signals in various frequency bands. For example, a first graph 910*a* and a second graph 920*a* illustrated in FIG. 9A may represent changes in the intensity of reflection signal measured at ¼× to 3× the frequencies of the PCI express 3.0. For another example, a third graph 910*b* and a fourth graph 920*b* illustrated in FIG. 9B may represent changes in the intensity of reflection signal measured in a sub-6 GHz frequency band. For another example, a fifth graph 910*c* and a sixth graph 920*c* illustrated in FIG. 9C may represent changes in the intensity of reflection signal measured in a millimeter wave frequency band.

According to an embodiment, the first graph 910*a*, the third graph 910*b*, or the fifth graph 910*c* represented by a solid line may represent the intensity of reflection signal measured when an internal impedance of an integrated circuit is not matched with an impedance of a conducting wire included in a printed circuit board. For example, the first graph 910*a*, the third graph 910*b*, or the fifth graph 910*c* may represent a reflection signal measured when the internal impedance of the integrated circuit is set to a standard impedance of the printed circuit board, for example, 50Ω and the impedance of the conducting wire included in the printed circuit board is 70Ω.

According to an embodiment, the second graph 920*a*, the fourth graph 920*b*, or the sixth graph 920*c* represented by a dotted line may represent a reflection signal measured in an integrated circuit according to an embodiment of the disclosure. For example, the second graph 920*a*, the fourth graph 920*b*, or the sixth graph 920*c* may represent the intensity of reflection signal measured in the integrated circuit that changes the internal impedance depending on the impedance of the conducting wire included in the printed circuit board.

Referring to FIG. 9A, when impedance matching is made between the integrated circuit and the conducting wire included in the printed circuit board in the ¼ to 3 multiple frequency band of the PCI express 3.0, the intensity of reflection signal may decrease as much as about 20 dB to 40 dB. Referring to FIG. 9B, when impedance matching is made between the integrated circuit and the conducting wire included in the printed circuit board in the sub-6 GHz frequency band, the intensity of reflection signal may decrease as much as about 30 dB. Referring to FIG. 9C, when impedance matching is made between the integrated circuit and the conducting wire included in the printed circuit board in the millimeter wave frequency band, the intensity of reflection signal may decrease as much as about 30 dB to 45 dB.

Through the simulation results illustrated in FIGS. 9A to 9C, it may be observed that an electronic device according to certain embodiments of the disclosure has improved transmission efficiency between integrated circuits.

According to an embodiment, an electronic device comprises a printed circuit board (PCB), a first IC, a second IC, and a conducting wire. The first IC is placed on the printed circuit board and includes a transmit pin that is electrically connected to the at least one conducting wire. The second IC is placed on the printed circuit board and includes a receive pin electrically connected to the conducting wire. The first IC is configured to transmit a specified signal having a first voltage through the transmit pin; and change an internal impedance of the first IC based on a reflected signal of the specified signal at a first time point.

According to an embodiment, the first IC can transmit information about an impedance of the at least one wire to the second IC, and the second IC is configured to change an internal impedance of the second IC based at least on the information about the impedance of the at least one wire.

According to an embodiment the second IC includes a receive buffer including a plurality of impedance elements. The second IC is configured to select one of the plurality of impedance elements included in the receive buffer.

According to an embodiments, the second IC further includes at least one demultiplexer configured to select the one of the plurality of impedance elements.

According to an embodiment, the first IC changes transmission power based on a loss voltage of the specified signal.

According to an embodiment, the first IC may include a transmit buffer including a plurality of impedance elements, and the first IC may select, as the internal impedance, a first impedance element of the plurality of impedance elements included in the transmit buffer for the purpose of transmitting the specified signal having the first voltage.

Also, the first impedance element may have a standard impedance value of the printed circuit board.

Also, the first IC may further include at least one demultiplexer that selects one of the plurality of impedance elements as the internal impedance.

According to an embodiment, the specified signal may correspond to a radio frequency (RF) signal, the first IC may include a plurality of variable inductors and a plurality of variable capacitors, and the first IC may change the internal impedance by using the plurality of variable inductors and the plurality of variable capacitors.

According to an embodiment, the first voltage may be implemented with a differential voltage.

According to an embodiment, the specified signal may be a step signal having a magnitude of the first voltage.

A method of changing an impedance of an integrated circuit included in an electronic device according to an embodiment may include transmitting a specified signal having a first voltage through a transmit pin, measuring a second voltage of the transmit pin, in which a reflection signal of the specified signal is included, at a first time point, obtaining an impedance of at least one conducting wire electrically connected with the integrated circuit based on the first voltage and the measured second voltage, and changing an internal impedance of the integrated circuit based on the obtained impedance of the at least one conducting wire such that the reflection signal decreases.

According to an embodiment, the method may further include transmitting information about the impedance to another integrated circuit electrically connected with the integrated circuit through the at least one conducting wire from the integrated circuit, and changing an internal impedance of the another integrated circuit based at least on the information about the impedance.

According to an embodiment, the method may further include measuring a third voltage of the transmit pin, in which only a direct current component remains, at a second time point when a specified time elapses after the first time point, obtaining a loss voltage due to the at least one conducting wire based on the first voltage and the measured third voltage, and changing a transmission power of the integrated circuit based on the obtained loss voltage.

According to an embodiment, the transmitting of the specified signal having the first voltage through the transmit pin may include selecting a first impedance element, which has a standard impedance value of a printed circuit board including the at least one conducting wire, from among a plurality of impedance elements included in the integrated circuit as the internal impedance of the integrated circuit.

An integrated circuit which is placed on a printed circuit board according to an embodiment may include a transmit pin for transmitting a specified electrical signal to another integrated circuit through at least one conducting wire included in the printed circuit board, a transmit buffer including a plurality of impedance elements and a demultiplexer for connecting one of the plurality of impedance elements with the transmit pin, and at least one controller electrically connected with the transmit buffer. The at least one controller may connect a first impedance element of the plurality of impedance elements with the transmit pin by using the demultiplexer, may output a specified signal having a first voltage to the transmit pin, may measure a second voltage of the transmit pin, in which a reflection signal of the specified signal is included, at a first time point, may obtain an impedance of the at least one conducting wire based on the first voltage and the measured second voltage, and may connect a second impedance element of the plurality of impedance elements with the transmit pin based on the obtained impedance of the at least one conducting wire.

According to an embodiment, the at least one controller may transmit information about the obtained impedance to the another integrated circuit electrically connected with the at least one conducting wire.

According to an embodiment, the at least one controller may measure a third voltage of the transmit pin, in which only a direct current component remains, at a second time point when a specified time elapses after the first time point, may obtain a loss voltage due to the at least one conducting wire based on the first voltage and the measured third voltage, and may change a transmission power based on the obtained loss voltage.

According to an embodiment, the first impedance element may have a standard impedance value of the printed circuit board.

According to an embodiment, the specified signal may be a step signal having a magnitude of the first voltage.

According to embodiments of the disclosure, even though an error occurs in manufacturing a PCB or an FPC, an integrated circuit may adaptively perform impedance mismatching; even though an impedance of an internal conducting wire of the PCB or the FPC varies depending on a change of an environment, the integrated circuit may adaptively perform impedance matching. As such, distortion may be prevented from occurring in a transmission signal.

According to embodiments of the disclosure, even though an error occurs in manufacturing a PCB or an FPC, an integrated circuit may adaptively perform impedance mismatching, and thus, distortion may be prevented from occurring in a transmission signal. Besides, a variety of effects directly or indirectly understood through this disclosure may be provided.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to certain embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a printed circuit board (PCB) including at least one conducting wire;
   a first integrated circuit (IC) placed on the printed circuit board and including a transmit pin electrically connected to the at least one conducting wire; and
   a second IC placed on the printed circuit board and including a receive pin electrically connected to the at least one conducting wire,
   wherein the first IC is configured to:
   transmit a specified signal having a first voltage through the transmit pin;
   change an internal impedance of the first IC based on a reflected signal of the specified signal at a first time point; and
   transmit information about an impedance of the at least one wire to the second IC; and
   wherein the second IC is configured to change an internal impedance of the second IC based at least on the information about the impedance of the at least one wire.

2. The electronic device of claim 1, wherein the second IC comprises a receive buffer including a plurality of impedance elements, and
   wherein the second IC is configured to select one of the plurality of impedance elements included in the receive buffer.

3. The electronic device of claim 2, wherein the second IC further includes:
   at least one demultiplexer configured to select the one of the plurality of impedance elements.

4. The electronic device of claim 1, wherein the first IC is configured to
   change a transmission power based on a loss voltage of the specified signal.

5. The electronic device of claim 1, wherein the first IC includes a transmit buffer including a plurality of impedance elements, and
   wherein the first IC is configured to select, as the internal impedance, a first impedance element of the plurality of impedance elements included in the transmit buffer.

6. The electronic device of claim 5, wherein the first impedance element has a standard impedance value of the printed circuit board.

7. The electronic device of claim 5, wherein the first IC further includes:
   at least one demultiplexer configured to select one of the plurality of impedance elements as the internal impedance.

8. The electronic device of claim 1, wherein the specified signal corresponds to a radio frequency (RF) signal,
   wherein the first IC includes a plurality of variable inductors and a plurality of variable capacitors, and
   wherein the first IC is configured to change the internal impedance by using the plurality of variable inductors and the plurality of variable capacitors.

9. The electronic device of claim 1, wherein the first voltage is implemented with a differential voltage.

10. The electronic device of claim 1, wherein the specified signal is a step signal having a magnitude of the first voltage.

* * * * *